(12) United States Patent
Morinaga

(10) Patent No.: US 6,297,150 B1
(45) Date of Patent: Oct. 2, 2001

(54) METHODS OF MANUFACTURING A SEMICONDUCTOR DEVICE WITH PORES FORMED BETWEEN AND OVER WIRING PATTERNS OF AN INTERLEVEL INSULATING LAYER

(75) Inventor: Shirou Morinaga, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/499,437

(22) Filed: Feb. 7, 2000

(30) Foreign Application Priority Data

Feb. 5, 1999 (JP) .................................................. 11-028628

(51) Int. Cl.$^7$ .............................................. H01L 21/4763
(52) U.S. Cl. ........................... 438/637; 438/624; 438/622; 438/631
(58) Field of Search ..................................... 438/622, 624, 438/631, 637, 706

(56) References Cited

U.S. PATENT DOCUMENTS

| | | | |
|---|---|---|---|
| 5,364,817 | * | 11/1994 | Lur et al. . |
| 5,641,712 | * | 6/1997 | Grivna et al. . |
| 5,719,084 | * | 2/1998 | Mallon et al. . |
| 5,728,631 | * | 3/1998 | Wang . |
| 5,789,819 | * | 8/1998 | Gnade et al. . |
| 5,949,143 | * | 9/1999 | Bang . |
| 6,022,802 | * | 2/2000 | Jang . |
| 6,211,057 | * | 4/2001 | Lin et al. . |

FOREIGN PATENT DOCUMENTS

| | | |
|---|---|---|
| 62-188230 | 8/1987 | (JP) . |
| 2-86146 | 3/1990 | (JP) . |
| 4-207055 | 7/1992 | (JP) . |

* cited by examiner

Primary Examiner—Charles Bowers
Assistant Examiner—Stephen W. Smoot
(74) Attorney, Agent, or Firm—Hutchins, Wheeler & Dittmar

(57) ABSTRACT

In a method of manufacturing a semiconductor device, an interlayer insulating film (3) is formed on lower-layer wires (2) formed on a semiconductor substrate (1), wherein an SiO$_2$ insulating layer (31) is formed, and a BPSG insulating layer (32) is formed on the SiO$_2$ insulating layer (31). Thereafter, a BPSG insulating layer (33) having higher fluidity to a heat treatment than the insulating layer (32) is formed on the BPSG insulating layer (32), a BPSG insulating layer (34) having the same fluidity to a heat treatment as the insulating layer (32) is formed on the BPSG insulating layer (33), and then the upper surface thereof is flattened. A perforation step is carried out to form pores penetrating through the insulating layers (32, 33 and 34), and then the heat treatment is carried out to fluidize the insulating layer (33) and close the pore portion in the insulating layer (33), thereby leaving the pore portion in the insulating layer (32) as voids (7). An SiO$_2$ insulating layer (35) is formed on the insulating layer (34), and upper-layer wires (4) and an insulating layer (5) are formed on the interlayer insulating film (3).

18 Claims, 6 Drawing Sheets

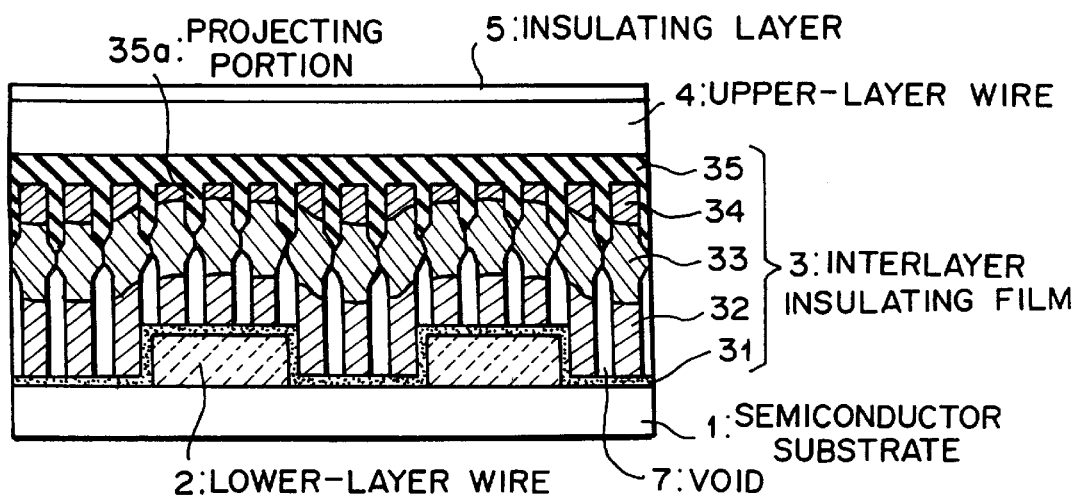
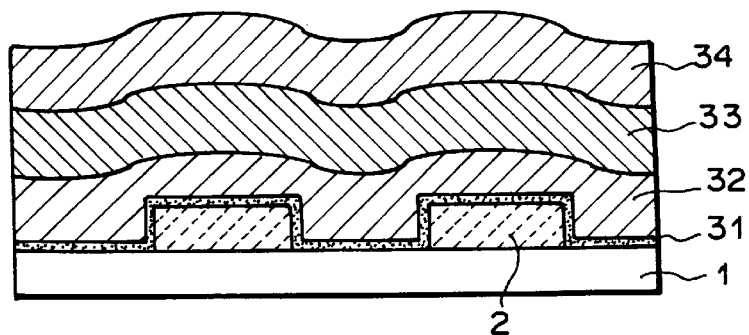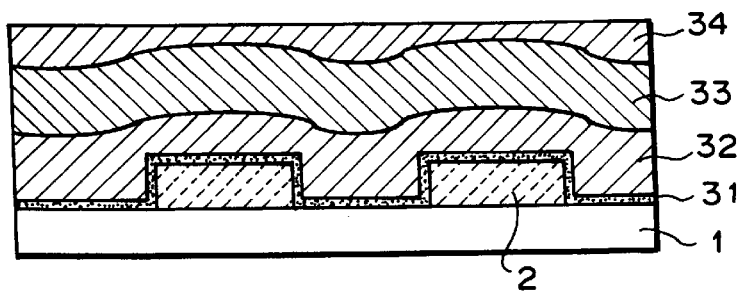

METHODS OF MANUFACTURING A SEMICONDUCTOR DEVICE WITH PORES FORMED BETWEEN AND OVER WIRING PATTERNS OF AN INTERLEVEL INSULATING LAYER

BACKGROUND OF THE INVENTION

1. Field of the Invention

The present invention relates to a technical field pertaining to semiconductor devices, and particularly to a semiconductor device having an insulating film with voids, and a semiconductor device manufacturing method characterized by a step of forming an insulating film having voids.

2. Description of the Related Art

A high-integration design has been required to be established for semiconductor devices, particularly LSI devices, and in order to satisfy this requirement, it is needed that wires to be connected to electronic circuit elements in the semiconductor device are designed in a microstructure, the intervals between respective wiring layers in a multi-layer wiring structure are reduced as much as possible and also the intervals between adjacent wires are reduced in the same wiring layer.

However, the microstructure design of wires reduces the distance between the wires, so that the capacitance between the wires is increased. Therefore, the transmission speed of signals to be transmitted through the wires is lowered, and thus the operation speed of the semiconductor device is lowered.

In order to avoid the above problems, it is necessary to suppress the increase of the capacitance caused by reducing the distance between wires. For this purpose, a method of lowering the dielectric constant of the insulating film located between wires has been utilized. In order to lower the dielectric constant of the insulting film, a method of forming voids (pores) in the insulating film has been proposed.

The following process may be used to form the voids in the insulating film. That is, an insulating film in which minute elusive portions made of a material having a relatively large etching selection ratio are dispersed into a base material having a relatively small etching selection ratio is formed, and then the overall surface of the insulating film is etched to remove the elusive portions and form the voids (pores). However, the etching process of this method could not bring an excellent effect if the elusive portions are adjacent to one another. Therefore, it is required to increase the occupation ratio of the elusive portions in the insulating film. However, this structure makes it difficult to obtain an insulating film having high strength. Further, it is impossible in this method to set the size, arrangement, etc. of the voids in a desirable style.

In another method of forming the voids in the insulating film, when the insulating film is deposited and formed by the CVD method or the like, voids are left on recess portions on the wire pattern forming surface serving as a base layer (Japanese Laid-open Patent Application No. Sho-62-188230, Japanese Laid-open Patent Application No. Hei-2-86146). However, according to this method, the voids can be formed only when a desired relationship is established among the distance between the adjacent wires, the film thickness of the wiring layer, the deposition condition of the insulating film, etc., and also it is difficult to set the size of the voids to a desired value. In addition, no void can be formed above the wires, and thus this method has no sufficient effect on the reduction of the capacitance between wires belonging to different wiring layers in the multi-layer wiring structure.

There is known another method of forming the voids in the insulating film (Japanese Laid-open Patent Application No. Hei-4-207055). According to this method, an insulating film is composed of a plurality of insulating layers. First, an intermediate insulating layer is formed on a lower insulating layer, windows are formed in the intermediate layer, and then the lower insulating layer is wet-etched through the windows to form pores between adjacent wires. Thereafter, an upper insulating layer is deposited and formed on the intermediate insulating layer, and the windows of the intermediate insulating layer are closed by utilizing the overhang based on the formation of the upper insulating layer, thereby forming voids between the adjacent wires. However, with this method, the material of the upper insulating layer invades into the pores between the adjacent wires through the windows during the period from the time when the deposition of the upper insulating layer is started until the time when the overhang of the upper insulating layer is formed on the windows of the intermediate insulating layer to close the windows by the overhang, whereby the material of the upper insulating layer is deposited on the substrate. Therefore, the voids formed between the adjacent wires are shallow in depth, and thus the effect of reducing the capacitance between the wires is lowered.

SUMMARY OF THE INVENTION

The present invention has been implemented in view of the foregoing problems, and has an object to provide a method of manufacturing a semiconductor device having an insulating film such as an inter-wiring-layer insulating film with pores, which can easily set the shape, dimension and position of pores to be formed, and form an interlayer insulating film having high strength.

Further, the present invention has another object to provide a semiconductor device having an insulating film which has pores and exhibits an excellent dielectric constant reducing effect.

Still further, the present invention has other object to provide a semiconductor device having an insulating film which has pores, but has high strength.

In order to attain the above objects, according to a first aspect of the present invention, there is provided a method of manufacturing a semiconductor device having an insulating film formed on a wiring layer, wherein the insulating film is formed by a process comprising the steps of: forming a lower insulating layer; forming on the lower insulating layer an upper insulating layer having higher fluidity to a heating treatment than the lower insulating layer; forming pores each extending from the upper insulating layer to the lower insulating layer; and then performing the heat treatment to fluidize the upper insulating layer and cover the portions of the pores in the upper insulating layer with the fluidized upper insulating layer, thereby leaving the portions of the pores in the lower insulating layer as voids.

The upper insulating layer may be formed of BPSG, BSG or PSG.

The insulating film may contain a first additional insulating layer on the upper insulating layer, the first additional insulating layer having lower fluidity to the heat treatment than the upper insulating layer, the pores being formed so as to penetrate through the first additional insulating layer. The upper surface of the first additional insulating layer may be flattened prior to the formation of the pores.

The insulating film may contain a second additional insulating layer on the first additional insulating layer, and the second additional insulating layer may be formed after the heat treatment so as to have projecting portions extending into portions of the pores in the first additional insulating layer. The second additional insulting layer may be formed so as to have minute voids in the projecting portions. The upper surface of the second additional insulating layer may be flattened.

The pores may be formed in a wiring pattern area of the wiring layer and/or the area between adjacent wiring patterns of the wiring layer.

According to a second aspect of the present invention, there is provided a method of manufacturing a semiconductor device having an insulating film formed on a wiring layer, wherein the insulating film is formed by a process comprising the steps of: forming a lower insulating layer; forming on the lower insulating layer an upper insulating layer having a lower etching rate than the lower insulating layer; forming pores each extending from the upper insulating layer to the lower insulating layer; performing an etching treatment to enlarge the portions of the pores in the lower insulating layer; and then performing a heat treatment to fluidize the upper insulating layer and cover the portions of the pores in the upper insulating layer with the fluidized upper insulating layer, thereby leaving the portions of the pores in the lower insulating layer as voids.

The etching treatment may be an isotropic wet etching treatment. The lower insulating layer may have higher fluidity to the heat treatment than the upper insulating layer. The lower insulating layer may be formed of BPSG, BSG or PSG, and the upper insulating layer may be formed of BPSG, BSG or PSG containing boron oxide and phosphorus oxide whose total content is smaller than that of the lower insulating layer.

The insulating film may contain a first additional insulating layer on the upper insulating layer, the first additional insulating layer having a higher etching rate than the upper insulating layer, the pores being formed so as to penetrate through the first additional insulating layer. The upper surface of the first additional insulating layer may be flattened prior to the formation of the pores.

The pores may be formed in the area between adjacent wiring patterns of the wiring layer. Upper-layer wires may be formed on the insulating film.

In the method according to the present invention, the pores may be formed by an anisotropic dry etching treatment.

According to a third aspect of the present invention, there is provided a semiconductor device having an insulating film formed on a wiring layer, characterized in that the insulating film contains at least a lower insulating layer and an upper insulating layer, voids are formed in the lower insulating layer so as to penetrate through the lower insulating layer in the thickness direction of the lower insulating layer, the upper insulating layer covers the voids, and the voids are formed in at least a wiring pattern area of the wiring layer.

According to a fourth aspect of the present invention, there is provided a semiconductor device having an insulating film formed on a wiring layer, characterized in that the insulating film contains at least a lower insulating layer and an upper insulating layer, voids are formed in the lower insulating layer so as to penetrate through the lower insulating layer in the thickness direction of the lower insulating layer, the upper insulating layer covers the voids, the voids are formed in at least the area between adjacent wiring patterns in the wiring layer, and the upper insulating layer is supported by the lower insulating layer at portions other than the voids in the area between the wiring patterns.

The voids may be arranged at plural intervals in the area between the wiring patterns. The upper insulating layer may have higher fluidity to a heat treatment than the lower insulating layer. The upper insulating layer may be formed of BPSG, BSG or PSG.

The insulating film may contain a first additional insulating layer on the upper insulating layer, and the first additional insulating layer may have lower fluidity to the heat treatment than the upper insulating layer.

The insulating film may contain a second additional insulating layer on the first additional insulating layer, and the second additional insulating layer may have projecting portions extending into pores which are formed in the first additional insulating layer in association with the voids. The second additional insulating layer may have minute voids in the projecting portions.

According to a fifth aspect of the present invention, there is provided a semiconductor device having an insulating film formed on a wiring layer, characterized in that the insulating film contains at least a lower insulating layer and an upper insulating layer, voids are formed in the lower insulating layer so as to penetrate through the lower insulating layer in the thickness direction of the lower insulating layer, the upper insulating layer covers the voids, and the lower insulating layer is designed so that the end face of the lower insulating layer which faces the voids is projected toward the voids in section containing the thickness direction of the lower insulating layer.

The upper insulating layer may have a lower etching rate to an isotropic wet etching treatment than the lower insulating layer. The lower insulating layer may be formed of BPSG, BSG or PSG, and the upper insulating layer may be formed of BPSG, BSG or PSG containing boron oxide and phosphorus oxide whose total content is smaller than that of the lower insulating layer.

The voids may be formed in at least the area between adjacent wiring patterns of the wiring layer.

The insulating film may contain a first additional insulating layer on the upper insulating layer, and the first additional insulating layer may have a higher etching rate than the upper insulating layer.

In the semiconductor device according to the present invention, upper-layer wires may be formed on the insulating film.

According to the semiconductor device manufacturing method of the present invention, the insulating layer is fluidized by the heat treatment to close the pores which are formed so as to penetrate through the insulating layer, thereby forming the voids below. Therefore, there can be formed the interlayer insulating film having voids whose shape, dimension and position can be easily set and which has high strength.

Further, according to the semiconductor device manufacturing method of the present invention, the voids are formed by fluidizing the insulating layer through the heat treatment, so that foreign matters are prevented from invading into the voids and thus the dielectric-constant reducing effect is not suppressed.

Still further, the semiconductor device of the present invention has an insulating film which has voids and is excellent in dielectric-constant reducing effect. In addition, it has an insulating film which have excellent strength although it has voids. Accordingly, according to the semiconductor device of the present invention, the capacitance between wires is reduced. Therefore, the processing speed of LSI can be increased, and the processing speed is not extremely reduced even when the wires and the arrangement thereof are made more minute due to the microstructure of LSI.

BRIEF DESCRIPTION OF THE DRAWINGS

FIG. 1 is a schematic cross-sectional view showing the construction of an interlayer insulating film of a semiconductor device manufactured by a first embodiment of a semiconductor device manufacturing method according to the present invention;

FIG. 2 is a schematic cross-sectional view showing a manufacturing step of the first embodiment of the method according to the present invention;

FIG. 3 is a schematic cross-sectional view showing a manufacturing step of the first embodiment of the method according to the present invention;

DETAILED DESCRIPTION OF THE PREFERRED EMBODIMENTS

Figure 4:
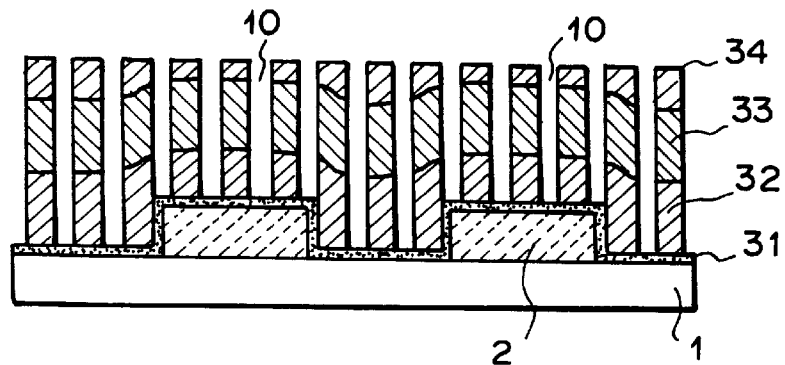
FIG. 4 is a schematic cross-sectional view showing a manufacturing step of the first embodiment of the method according to the present invention.

Preferred embodiments of a semiconductor device and a semiconductor device manufacturing method according to the present invention will be described hereunder with reference to the accompanying drawings.

FIG. 1 is a schematic cross-sectional view showing the construction of an insulating film (interlayer insulating film) of a semiconductor device manufactured by a first embodiment of the method according to the present invention.

Electronic circuit elements such as transistors, capacitors, resistors, etc. are formed in a region (not shown) on a semiconductor substrate 1 such as a silicon substrate or the like, and lower-layer wires 2 of conductor such as titanium, gold, copper or the like are formed on the area shown in FIG. 1 on the upper surface of the semiconductor substrate 1 to connect the above electronic circuit elements to one another or to an external circuit. The lower-layer wires 2 are formed in a desired pattern on the surface of the substrate 1. In FIG. 1, it is illustrated that two wires 2 are formed so as to extend in parallel to each other vertically to the sheet surface of the drawing. For example, the wires 2 are designed so that the thickness thereof is set to about 2000 to 4000 Å, the width (the dimension in the right-and-left direction in FIG. 1) is set to about 0.5 to 1.0 $\mu$m and the interval between the two adjacent wires 2 is set to about 0.5 to 2.0 $\mu$m.

Further, the interlayer insulating film 3 is formed so as to cover the lower-layer wires 2. The interlayer insulating film 3 comprises first to fifth insulating layers 31 to 35.

The first insulating layer 31 uniformly covers the lower-layer wires 2 and the exposed portions of the semiconductor substrate 1, functions to protect the lower-layer wires and is formed of an $SiO_2$ film or SiN film having a thickness of about 1000 Å.

The second insulating layer (the lower insulating layer) 32 is formed on the first insulating layer 31, and has many pores (voids) 7 penetrating therethrough in the up-and-down direction (layer thickness direction). The diameter of the voids 7 is set to about 0.1 to 0.3 $\mu$m, and the interval between the adjacent voids 7 is set to about 0.1 to 0.3 $\mu$m. The second insulating layer 32 is formed of a BPSG (Boron Phosphorus Silicate Glass) film, a BSG (Boron Silicate Glass) film, a PSG (Phosphorus Silicate Glass) or an $SiO_2$ film which has a thickness of about 3000 to 5000 Å and contains a relatively small content of B (Boron) and/or P (Phosphorus) (actually, the total content of boron oxide and phosphorus oxide to be contained: molar ratio).

The third insulating layer (upper insulating layer) 33 is formed on the second insulating layer 32 so as to cover the voids 7. The third insulating layer 33 is formed of a BPSG film, a BSG film or a PSG film which has a thickness of about 3000 to 5000 Å and contains a relatively large content of B and/or P.

The content of B and/or P to be contained in the BPSG film, the BSG film or the PSG film will be described later.

The fourth insulating layer 34 is formed on the third insulating layer 33, and has pores extending in the up-and-down direction at the positions corresponding to the voids 7 of the second insulating layer 32. The fourth insulating layer 34 is formed of a BPSG film, a BSG film, a PSG film or an $SiO_2$ film which contains a relatively small content of B and/or P like the second insulating layer 32.

The fifth insulating layer 35 is formed on the fourth insulating layer 34 so as to cover the fourth insulating layer 34 and has projecting portions 35a extending into the pores of the fourth insulating layer 34. The fifth insulating layer 35 is formed of an $SiO_2$ or SiN film. Both of the upper surface of the fourth insulating layer 34 and the upper surface of the fifth insulating layer 35 are flattened so as to be parallel to the surface of the semiconductor substrate 1.

Further, upper-layer wires 4 of conductor such as titanium, gold, copper or the like are formed on the interlayer insulating film 3. The upper-layer wires 4 are formed in a desired pattern on the surface of the fifth insulating layer 35 of the interlayer insulating film 3, and it is illustrated in FIG. 1 that the interlayer insulating film 3 extends in a direction parallel to the sheet surface of the drawing. The dimension of the upper-layer wires 4 such as the thickness and width thereof and the interval between adjacent two upper-layer wires 4 is set to the same as the lower-layer wires 2. An insulating layer 5 of an $SiO_2$ film or SiN film is formed so as to uniformly cover the upper-layer wires 4 (and the exposed portion of the fifth insulating layer 35).

Next, the manufacturing process of this embodiment will be described with reference to FIGS. 2 to 8.

First, as shown in FIG. 2, the lower-layer wires 2 are formed in a desired pattern on the semiconductor substrate 1, and then the first to fourth interlayer insulating layers 31 to 34 are formed in four steps. Subsequently, as shown in FIG. 3, the surface of the fourth insulating layer 34 is flattened by CMP or etching. In this case, the upper surface of the fourth insulating layer 34 may not be subjected to the flattening treatment.

Figure 5:
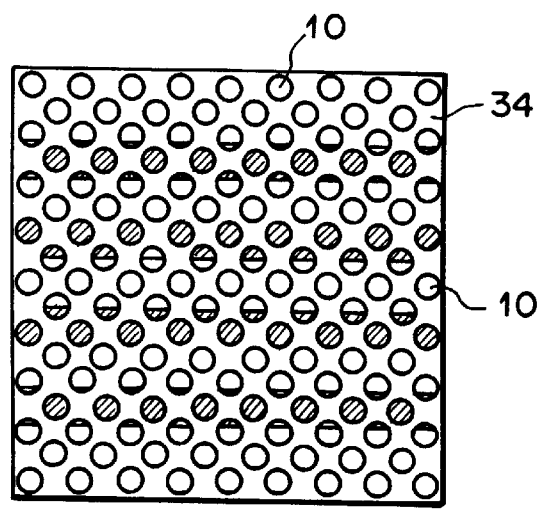
FIG. 5 is a schematic plan view showing a manufacturing step of the first embodiment of the method according to the present invention.

Subsequently, as shown in FIGS. 4 and 5, an anisotropic dry etching treatment is applied to the insulating layers 32 to 34 so that many pores 10 of about 0.2 to 0.5 $\mu m$ in inner diameter are formed in the insulating layers 32 to 34 so as to penetrate through the fourth insulating layer 34, the third insulating layer and the second insulating layer 32. FIG. 5 is a top view of the state of FIG. 4 which is taken from the upper side. The inner diameter of each pore 10 and the interval between the adjacent pores 10 are set to the same values as the voids 7 shown in FIG. 1.

Figure 6:
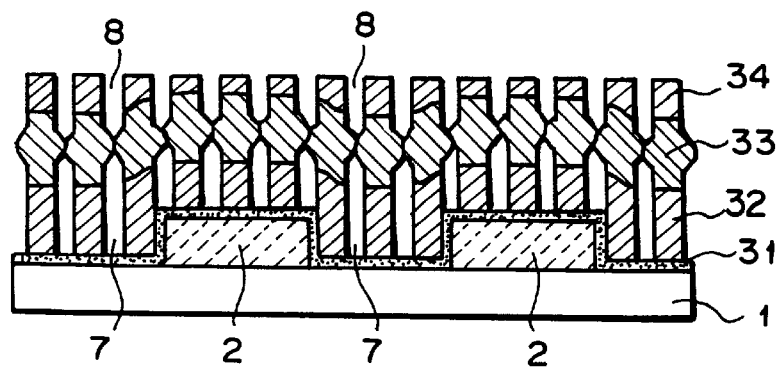
FIG. 6 is a schematic cross-sectional view showing a manufacturing step of the first embodiment of the method according to the present invention.
Figure 7:
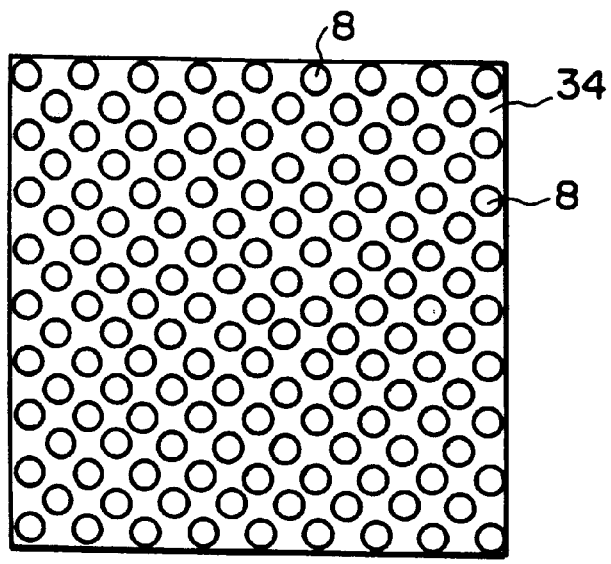
FIG. 7 is a schematic plan view showing a manufacturing step of the first embodiment of the method according to the present invention.

Subsequently, as shown in FIGS. 6 and 7, a heat treatment is carried out to fluidize the third insulating layer 33 and close the pores 10 in the third insulating layer 33. At this time, the second insulting layer 32 and the fourth insulating layer 34 are less liable to be fluidized than the third insulating layer 33, and thus the pores 10 in these insulating layers 32 and 34 are left as they are. When the third insulating layer 33 is thermally fluidized, the fourth insulating layer 34 existing on the third insulating layer 33 acts as "weight", and it promotes the thermal fluidization of the third insulating layer 33.

The heat treatment will be described in more detail.

In this embodiment, the third insulating layer 33 is formed of a material which has higher fluidity to the heat treatment (more liable to be thermally fluidized) than the materials of the second insulating layer 32 and the fourth insulating layer 34. The fluidity to the heat treatment is determined by the material used as the insulating layer. For example, the variation in thermal fluidity of BPSG, PSG and $SiO_2$ in accordance with the content of B and/or P is shown in Table 1. In Table 1, Tg represents the glass transition temperature, and Tf represents a temperature used in a process of using the material of the composition concerned as the third insulating layer 33 and performing a heat treatment on the material for about 30 minutes under the nitrogen atmosphere to fluidize the material, thereby closing the pores.

TABLE 1

| COMPOSITION No. | $SiO_2$ [mol %] | $P_2O_5$ [mol %] | $B_2O_3$ [mol %] | Tg [° C.] | Tf [° C.] |
|---|---|---|---|---|---|
| 1 | 100 | — | — | 1160 | |
| 2 | 92 | 8 | — | 725 | 1000 |
| 3 | 87 | 7 | 6 | 675 | 950 |
| 4 | 83.9 | 4.2 | 11.9 | 645 | 925 |
| 5 | 75 | 8 | 17 | 610 | 900 |

In Table 1, the composition No. 1 represents $SiO_2$, the composition No. 2 represents PSG and the composition Nos. 3 to 5 represent BPSG.

The content of B and/or P is gradually increased and the thermal fluidity is also gradually increased as the composition No. is shifted from No. 1 to No. 5. When the composition No. 4 is used for the third insulating layer 33, the composition Nos. 1 to 3 are each used for the second insulating layer 32 and the fourth insulating layer 34. Particularly when the composition Nos. 1 or 2 is used, the difference in glass transition temperature from the second insulating layer 32 is increased, so that the shape of the voids 7 formed in the second insulating layer 32 is hardly varied.

Table 1 shows BPSG and PSG, and BSG has the same behavior. Accordingly, for BPSG, PSG and BSG, it is proved that the thermal fluidity is increased as the content of B and/or P increases.

The comparison of the fluidity to the heat treatment defined in the present invention is established on the basis of the above comparison. Accordingly, if a first material needs a higher temperature than that for a second material to provide the same fluidity, it means that the first material has lower fluidity than that of the second material to the heat treatment.

Many voids 7 are formed in the second insulating layer 32 by the above heat treatment (a part of each void 7 extends into the lower surface portion of the third insulating layer 33), and in connection with the voids 7 many pores 8 are formed in the fourth insulating layer 34 (a part of each pore 8 extends into the upper surface potion of the third insulating layer 33). FIG. 7 is a top view of the state of FIG. 6 which is taken from the upper side.

Figure 8:
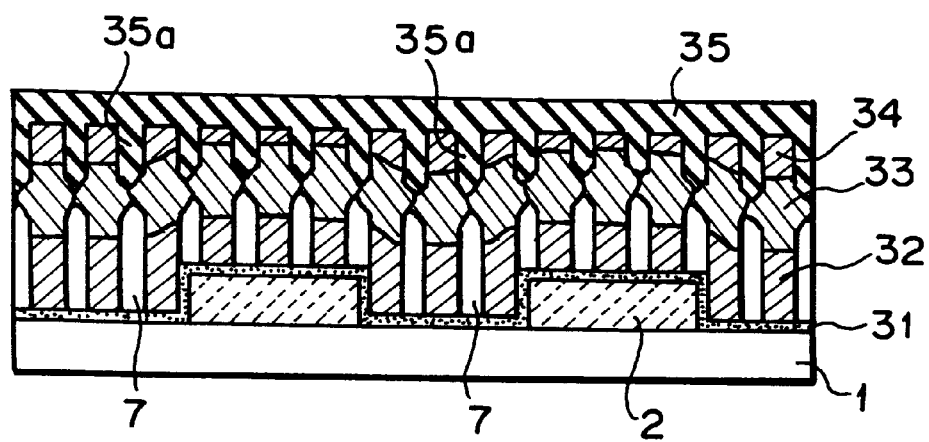
FIG. 8 is a schematic cross-sectional view showing a manufacturing step of the first embodiment of the method according to the present invention.

Subsequently, the fifth insulating layer 35 is formed on the fourth insulating layer 34 as shown in FIG. 8. At this time, a part of the fifth insulating layer 35 invades into the pores 8 formed in the fourth insulating layer 34 to form the projecting potions 35a. Subsequently, the surface of the fifth insulating layer 35 is flattened by CMP or etching.

Thereafter, the upper-layer wires 4 are formed on the fifth insulating layer 35 as in the case of the formation of the lower-layer wires 2, and the insulating layer 5 is formed on the upper-layer wires 4 as in the case of the formation of the first insulating layer 31, thereby achieving a semiconductor device having the structure shown in FIG. 1.

In the manufacturing process described above, the third insulating layer 33 is fluidized by the heat treatment to close the pores 10 and form voids 7. With this process, the probability that the deposition of foreign matters in the voids 7 would occur can be reduced to substantially zero. Accordingly, the voids can be formed in shape and dimension which are extremely approximate to the desired shape and dimension, and the reduction of the dielectric constant can be desirably performed.

In the semiconductor device manufactured by the method of this embodiment, the voids 7 are formed in the interlayer insulating film 3 in the area between the adjacent wiring patterns of the lower-layer wires 2, and thus the capacitance between the wiring patterns can be reduced. Further, since the voids 7 are formed in the interlayer insulating film 3 in the wiring pattern area of the lower-layer wires 2, that is, the voids 7 are formed in the interlayer insulating film 3 between the lower-layer wires 2 and the upper-layer wires 4, the capacitance between the lower-layer and upper-layer wires can be reduced. An interlayer insulating film which is similar to the interlayer insulating film 3 may be formed on the upper-layer wires 4 while containing the insulating layer 5 and then a third wiring layer may be formed on the interlayer insulating film concerned. In this case, the capacitance between the wiring patterns of each wiring layer and the capacitance between the wiring layers can be also reduced.

In the semiconductor device of this embodiment, the voids in the insulating film 3 are formed so as to penetrate through the second insulating layer 32 in the up-and-down direction. In addition, in the area between the adjacent wires 2 and the area above the wires 2, the third insulating layer 33 are excellently supported in the up-and-down direction by the non-void portion of the second insulating layer 32 in which the voids 7 are formed. As described above, the semiconductor device of this embodiment is provided with the insulating film which is provided with voids, has a high dielectric-constant reducing effect and has high strength.

As described above, by forming the voids in the interlayer insulating film, the dielectric constant of the interlayer insulating film is reduced and thus the capacitance between the wires (wiring patterns) through the interlayer insulating film is reduced, so that the processing speed of LSI can be increased. In addition, the processing speed is not extremely lowered even when the wires are designed and arranged in a higher microstructure.

In the above embodiment, the fourth insulating layer 34 may be omitted.

Figure 9:
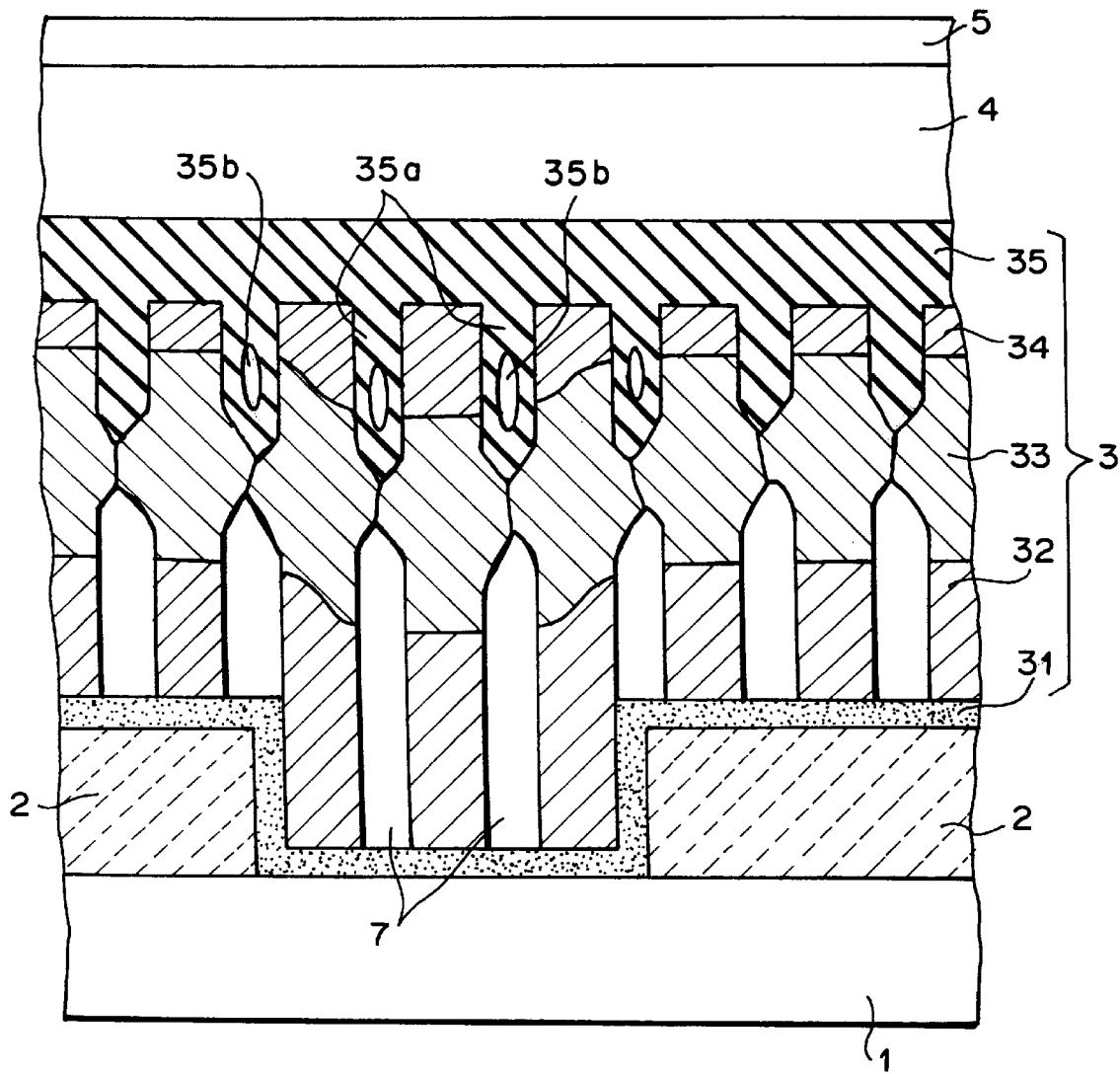
FIG. 9 is a schematic cross-sectional view showing a modification of the first embodiment of the method according to the present invention.

FIG. 9 shows a modification of the first embodiment of the present invention.

In this modification, minute voids 35b are formed in the projecting portions 35a extending into the pores of the fourth insulating layer 34. This structure can be obtained as disclosed in Japanese Laid-open Patent Application No. Sho-62-188230 and Japanese Laid-open Patent Application No. Hei-2-86146 when the material of the fifth insulating layer 35 is not perfectly filled in the pores formed in the fourth insulating layer 34 due to the relationship between the inner diameter and the depth of the pores formed in the fourth insulating layer 34, the deposition condition for the formation of the fifth insulating layer 35, etc. The minute voids 35b are additionally provided to the voids 7, and no problem occurs even when the shape and dimension of the minute voids 35b is somewhat dispersed.

According to this modification, the minute voids 35b as well as the voids 7 are formed in the insulating film 3 between the lower-layer wires 2 and the upper-layer wires 4, so that the dielectric constant of the insulating film 3 between the lower-layer wires 2 and the upper-layer wires 4 can be further reduced.

Next, the manufacturing process of a second embodiment of the semiconductor device manufacturing method according to the present invention will be described with reference to FIGS. 10 to 15. In these figures, the portions having the same functions as shown in FIGS. 1 to 9 are represented by the same reference numerals. The second embodiment is effectively applied to the case where the distance between the adjacent wires in the lower-layer wires is small and the increase of the capacitance between the wires mainly due to the small distance between the adjacent wires induce problems in LSI operation.

Figure 10:
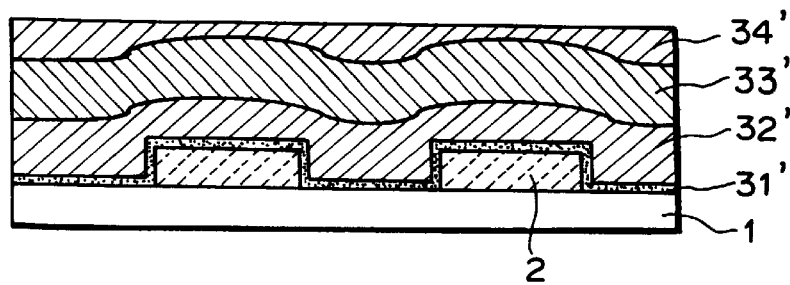
FIG. 10 is a schematic cross-sectional view showing a manufacturing step of a second embodiment of the method according to the present invention.

In this embodiment, as in the case of the first embodiment, after the lower-layer wires 2 are formed on the semiconductor substrate 1, first to fourth insulating layers 31' to 34' are formed in four steps, and then the surface of the fourth insulating layer 34' is flattened by CMP or etching as shown in FIG. 10.

Here, the same material as the first insulating layer 31 of the first embodiment may be used as the first insulating layer 31'. However, the second to fourth insulating layers 32' to 34' are formed of materials different from those of the first embodiment as explained later.

Figure 11:
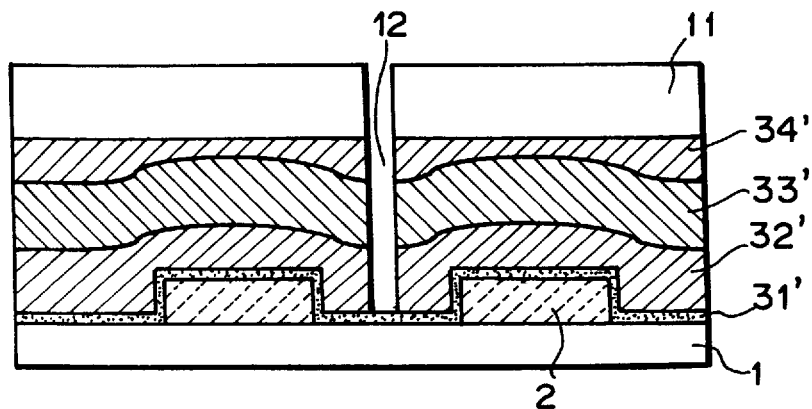
FIG. 11 is a schematic cross-sectional view showing a manufacturing step of the second embodiment of the method according to the present invention.

Subsequently, as shown in FIG. 11, in order to etch the portion of the insulating layers 32' to 34' corresponding to the area between the adjacent wires at the portion where the pattern arrangement of the lower-layer wires 2 is dense, a resist film 11 of a desired pattern is formed and then an anisotropic dry etching treatment is carried out to form pores 12.

Figure 12:
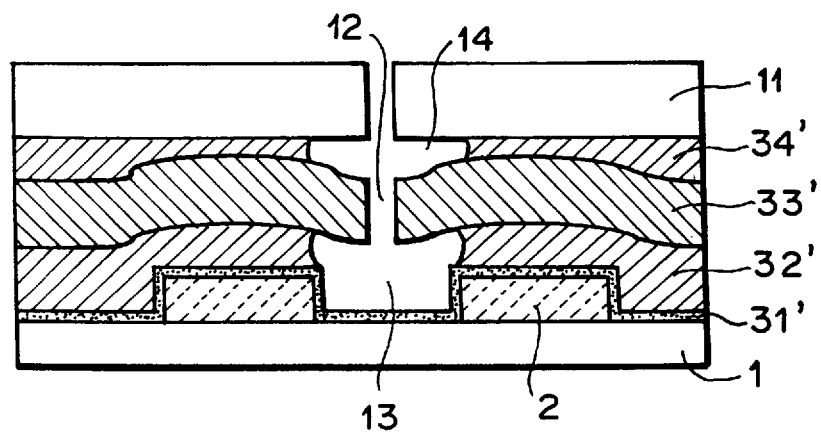
FIG. 12 is a schematic cross-sectional view showing a manufacturing step of the second embodiment of the method according to the present invention.

Subsequently, as shown in FIG. 12, an isotropic wet etching treatment is carried out by using hydrofluoric acid so that the third insulating layer 33' remains and the second and fourth insulating layers 32' and 34' are removed in the areas where the patterns of the lower-layer wires 2 are adjacent to one another. Here, since the first insulating layer 31' is formed of a silicon nitride film or the like which has a lower etching rate than the materials of the second to fourth insulating layers 32' to 34', the silicon nitride film functions as an etching stopper. Here, the third insulating layer 33' has a lower etching rate than the second and fourth insulating layers 32' and 34', so that voids 13, 14 are formed in the second and fourth insulating layers 32' and 34' at the areas between the adjacent patterns of the lower-layer wires 2 as shown in FIG. 12.

In this embodiment, in order to perform the isotropic etching treatment as described above, BPSG, BSG or PSG having a relatively large content of B and/or P is used for the second insulating layer 32' and the fourth insulating layer 34', and BPSG, BSG or PSG having a relatively small content of B and/or P is used for the third insulating film 33'. This relationship is just inverse to the relationship in the case of the first embodiment, and the second insulating layer 32' and the fourth insulating layer 34' have high fluidity to the heat treatment (i.e., more liable to be thermally fluidized) than the third insulating layer 33'.

Figure 13:
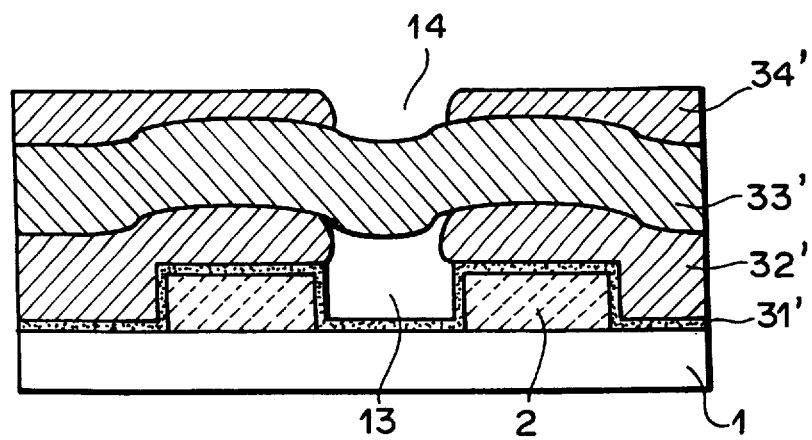
FIG. 13 is a schematic cross-sectional view showing a manufacturing step of the second embodiment of the method according to the present invention.

Subsequently, the heat treatment is carried out to fluidize the third insulating layer 33', and the pores 12 formed in the third insulating layer 33' are closed as shown in FIG. 13. That is, the heat treatment is carried out at such a temperature that the third insulating layer 33' is fluidized, whereby the voids 13 formed in the second insulating layer 32' are closed. During this heat treatment, the second and fourth insulating layers 32' and 34' are also fluidized and deformed because the fluidity of the second and fourth insulating layers 32' and 34' is higher than the fluidity of the third insulating layer 33'. That is, the second insulating layer 32' is shaped so that particularly the end faces thereof facing the voids 13 are projected toward the voids 13 or made convex in the section containing the thickness direction thereof (the section shown in FIG. 13) by the weighting effect of the third and fourth insulating layers 33' and 34'. However, since the voids 13 and 14 are formed so as to be enlarged in inner diameter by the isotropic etching treatment, the voids 13, 14 are prevented from being extinguished.

Figure 14:
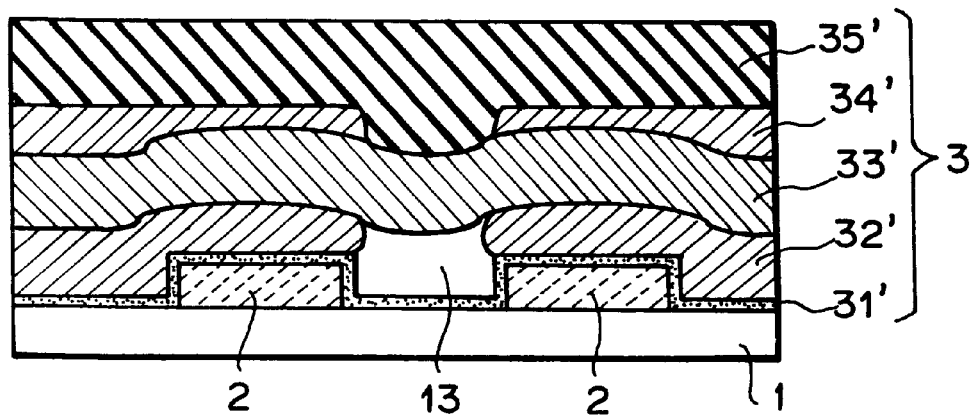
FIG. 14 is a schematic cross-sectional view showing a manufacturing step of the second embodiment of the method according to the present invention.

Subsequently, as in the case of the first embodiment, the fifth insulating layer 35' is formed on the fourth insulating layer 34' and the surface of the fifth insulating layer 35' is flattened by CMP or etching as shown in FIG. 14.

Figure 15:
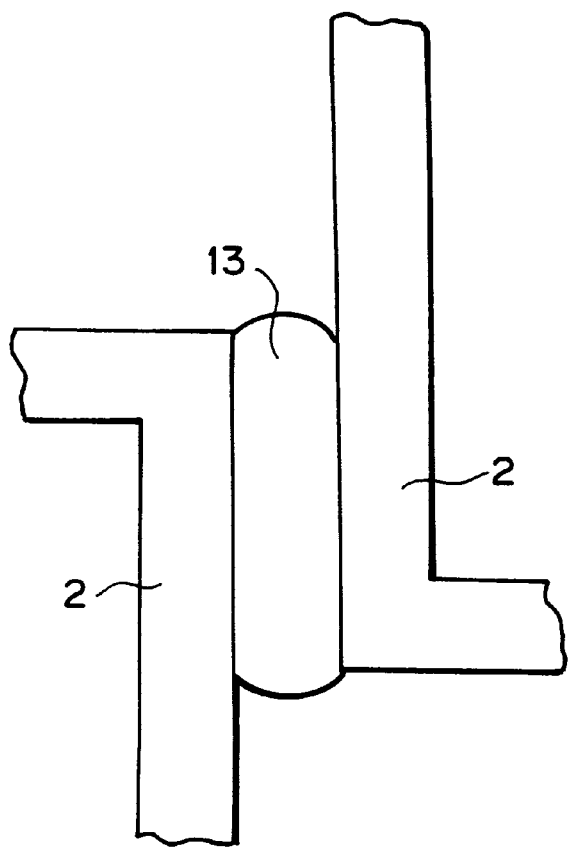
FIG. 15 is a schematic plan view showing the relationship between a lower-layer wire and a void in the second embodiment of the present invention.

FIG. 15 is a schematic plan view showing the relationship between the lower-layer wires 2 and the void 13. As shown in FIG. 15, the void 13 is formed at the position at which the interval between the adjacent wires 2 is small, and thus the second insulating layer 32' faces the void 13 at the upper edge positions of the confronting end faces of the adjacent wires 2. That is, the shape and position of the portion of the second insulating layer 32' facing the void 13 are varied from the state of FIG. 12 to the state of FIG. 13 through the fluidization caused by the heat treatment. However, the upper edge positions of the end faces of the wires 2 are stable positions therefor, and thus the portion of the second insulating layer 32' facing the void 13 is stably and fixedly located at the upper edge positions of the end faces of the wires 2. Accordingly, in this embodiment, even when there is a little error in the position of the pores 12 formed in the resist film 11, etc. in FIG. 11, the center of the void 13 is located just at the center position of the area between the two wires 2 by shifting its state of FIG. 12 to the state of FIG. 13 through the heat treatment. Therefore, the positioning precision required for the step of forming the pores 12 in the resist film 11, etc. can be moderated.

In the second embodiment, the inter-wire capacitance reducing effect can be also achieved by the reduction of the dielectric constant between the adjacent wires 2 as in the case of the first embodiment.

What is claimed is:

1. A method of manufacturing a semiconductor device having an insulating film formed on a wiring layer, comprising the steps of:

forming a lower insulating layer;

forming on said lower insulating layer an upper insulating layer having higher fluidity to a heating treatment than said lower insulating layer;

forming pores each extending via said upper insulating layer and said lower insulating layer; and performing said heat treatment to fluidize said upper insulating layer and cover said pores with said upper insulating layer fluidized, thereby leaving portions of said pores in said lower insulating layer as voids, whereby said insulating film is formed.

2. The method as claimed in claim 1, wherein said upper insulating layer is formed of BPSG, BSG or PSG.

3. The method as claimed in claim 1, wherein said pores are formed in a wiring pattern area of said wiring layer.

4. The method as claimed in claim 1, wherein said pores are formed in the area between adjacent wiring patterns of said wiring layer.

5. The method as claimed in claim 1, wherein said insulating film contains a first additional insulating layer on said upper insulating layer, said first additional insulating layer has lower fluidity to the heat treatment than said upper insulating layer, and said pores are formed so as to penetrate through said first additional insulating layer.

6. The method as claimed in claim 5, wherein the upper surface of said first additional insulating layer is flattened prior to the formation of said pores.

7. The method as claimed in claims 5, wherein said insulating film contains a second additional insulating layer on said first additional insulating layer, and said second additional insulating layer is formed after said heat treatment so as to have projecting portions extending into portions of said pores in said first additional insulating layer.

8. The method as claimed in claim 7, wherein said second additional insulating layer is formed so as to have minute voids in the projecting portions.

9. The method as claimed in claim 7, wherein the upper surface of said second additional insulating layer is flattened.

10. A method of manufacturing a semiconductor device having an insulating film formed on a wiring layer, comprising the steps of:

forming a lower insulating layer;

forming on said lower insulating layer an upper insulating layer having a lower etching rate than said lower insulating layer;

forming pores each extending via said upper insulating layer and said lower insulating layer;

performing an etching treatment to enlarge portions of said pores in said lower insulating layer; and performing a heat treatment to fluidize said upper insulating layer and cover said pores with said upper insulating layer fluidized, thereby leaving portions of said pores in said lower insulating layer as voids, whereby said insulating film is formed.

11. The method as claimed in claim 10, wherein said etching treatment is an isotropic wet etching treatment.

12. The method as claimed in claim 10, wherein said lower insulating layer has higher fluidity to the heat treatment than said upper insulating layer.

13. The method as claimed in claim 12, wherein said lower insulating layer is formed of BPSG, BSG or PSG, and said upper insulating layer is formed of BPSG, BSG or PSG containing boron oxide and phosphorus oxide whose total content is smaller than that of said lower insulating layer.

14. The method as claimed in claim 10, wherein said insulating film contains a first additional insulating layer on said upper insulating layer, said first additional insulating layer has a higher etching rate than said upper insulating layer, and said pores are formed so as to penetrate through said first additional insulating layer.

15. The method as claimed in claim 14, wherein the upper surface of said first additional insulating layer is flattened prior to the formation of the pores.

16. The method as claimed in claim 10, wherein said pores are formed in the area between adjacent wiring patterns of said wiring layer.

17. The method as claimed in claim 1 or 10, wherein upper-layer wires are formed on said insulating film.

18. The method as claimed in claim 1 or 10, wherein said pores are formed by an anisotropic dry etching treatment.

* * * * *